United States Patent [19]

Beuscher

[11] 4,313,217

[45] Jan. 26, 1982

[54] FREQUENCY STANDARD

[76] Inventor: Donald A. Beuscher, 30 Chandelle Dr., Rte. 3, Hampshire, Ill. 60140

[21] Appl. No.: 146,644

[22] Filed: May 5, 1980

[51] Int. Cl.³ .................... H04B 17/00; H04B 1/26
[52] U.S. Cl. ............................. 455/226; 455/314; 324/79 R
[58] Field of Search ............... 455/67, 226, 314, 315, 455/155; 324/79 R

[56] References Cited

U.S. PATENT DOCUMENTS

| | | | |
|---|---|---|---|
| 3,032,650 | 5/1962 | Mathison et al. | 455/226 |
| 3,200,337 | 8/1965 | Richardson et al. | 455/226 |
| 3,736,510 | 5/1973 | Wu | 455/226 |
| 3,821,649 | 6/1974 | Grosjean | 455/155 |
| 3,882,398 | 5/1975 | Ogita | 455/155 |

*Primary Examiner*—Jin F. Ng
*Attorney, Agent, or Firm*—McCaleb, Lucas & Brugman

[57] ABSTRACT

A frequency standard is operable to provide an output signal at a frequency which is directly proportional to the frequency of a received radio frequency signal. The frequency standard circuit contains a mixer which generates an intermediate frequency signal from the radio frequency signal and a local oscillator signal. The frequencies of the local oscillator and the amplified intermediate frequency signals are multiplied or divided by the same factor and then combined in another mixer to obtain an output signal having a frequency directly proportional to that of the received radio frequency signal.

8 Claims, 5 Drawing Figures

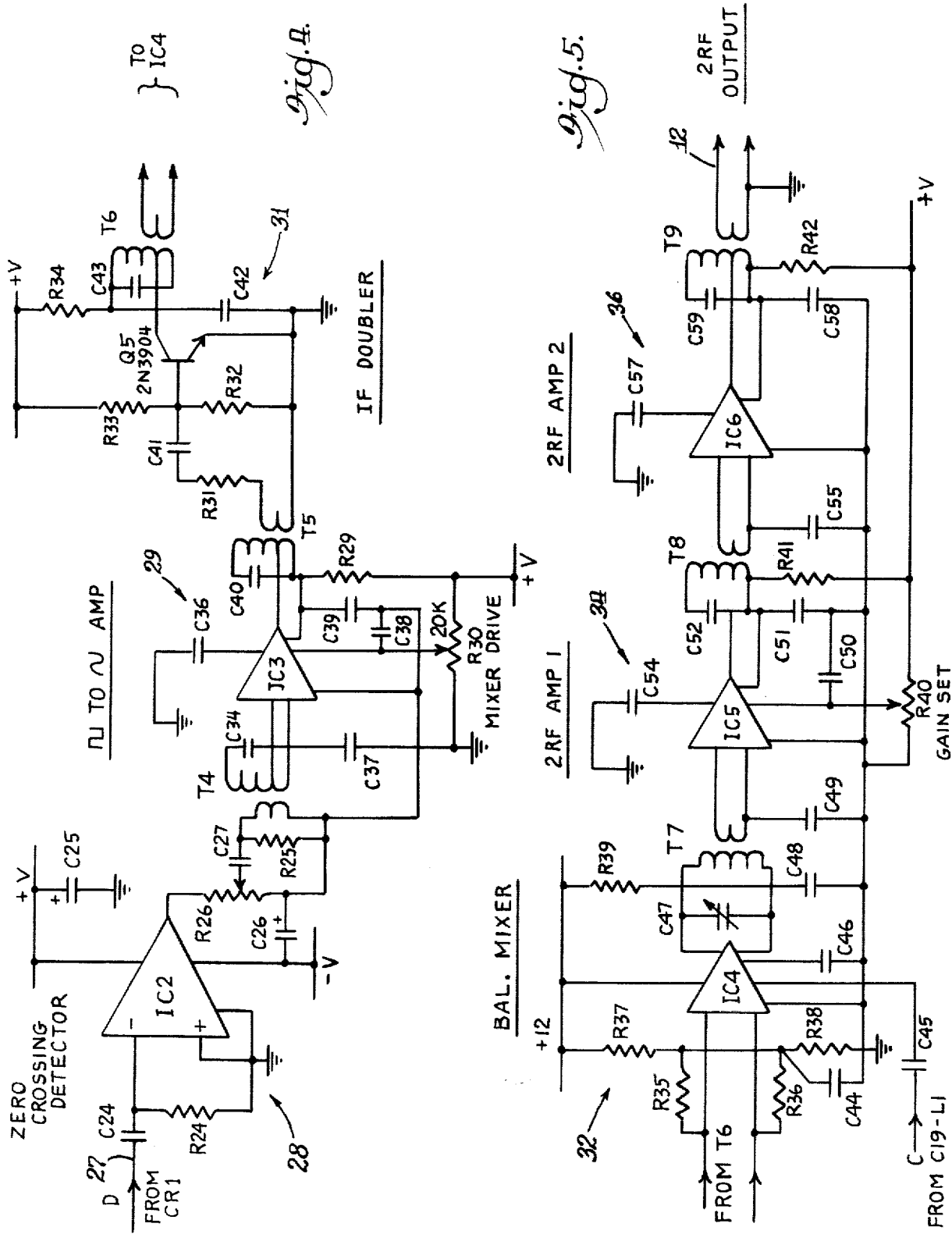

FREQUENCY STANDARD

BACKGROUND OF THE INVENTION

1. Field of the Invention

The present invention relates in general to frequency standards and frequency measuring devices.

2. Description of the Prior Art

The dissemination and use of frequency standards is extremely important to many of the activities of everyday living. For example, radio and television stations and navigators of ships and airplanes require precise, constantly available and internationally recognized frequency standards for proper regulation of their equipment. In the United States, the National Bureau of Standards broadcasts continuous signals at standard frequencies from its high-frequency radio station WWV.

To effectively utilize such radiated radio frequency standard signals, need has arisen for practical, reliable and relatively inexpensive devices for generating signals at useable strength levels and at frequencies which are directly related to those of the standard signals. The strength of a typical received radio frequency signal is in the micro-volt range; in order to use this low-level signal, it must be amplified to a value on the order of 0.25 volts, a much higher voltage level. In the use of conventional amplification techniques, it has been found that undesirable feedback frequently causes oscillation, thereby preventing reception and use of the received radio frequency signal.

SUMMARY OF THE INVENTION

The present invention is a frequency standard operable to provide a useable output signal at a frequency which is directly related to that of a received radio frequency signal without undesirable receiver oscillation.

In general, the present invention comprises a mixer for mixing the received radio frequency signal and a local oscillator signal in order to generate, by the superheterodyne technique, a signal at an intermediate frequency. Frequency multipliers or dividers multiply or divide the frequencies of the local oscillator and amplified intermediate signals by the same scaling factor which is an integer other than one. A second mixer combines the frequency-scaled local oscillator and intermediate signals in order to obtain the frequency standard output signal. Because the scaled local oscillator frequency and scaled intermediate frequency signals are cancelled out in the second mixer, the stability of the local oscillator is unimportant. The frequency scaling scheme breaks the otherwise possible feedback path in order to prevent oscillation upon amplification of the radio frequency signal. The output of the frequency standard can be appropriately multiplied or divided to a desired value.

BRIEF DESCRIPTION OF THE DRAWINGS

FIGS. 2 through 5 are schematic diagrams of the circuitry illustrated generally in FIG. 1.

DESCRIPTION OF THE PREFERRED EMBODIMENT

Figure 1:
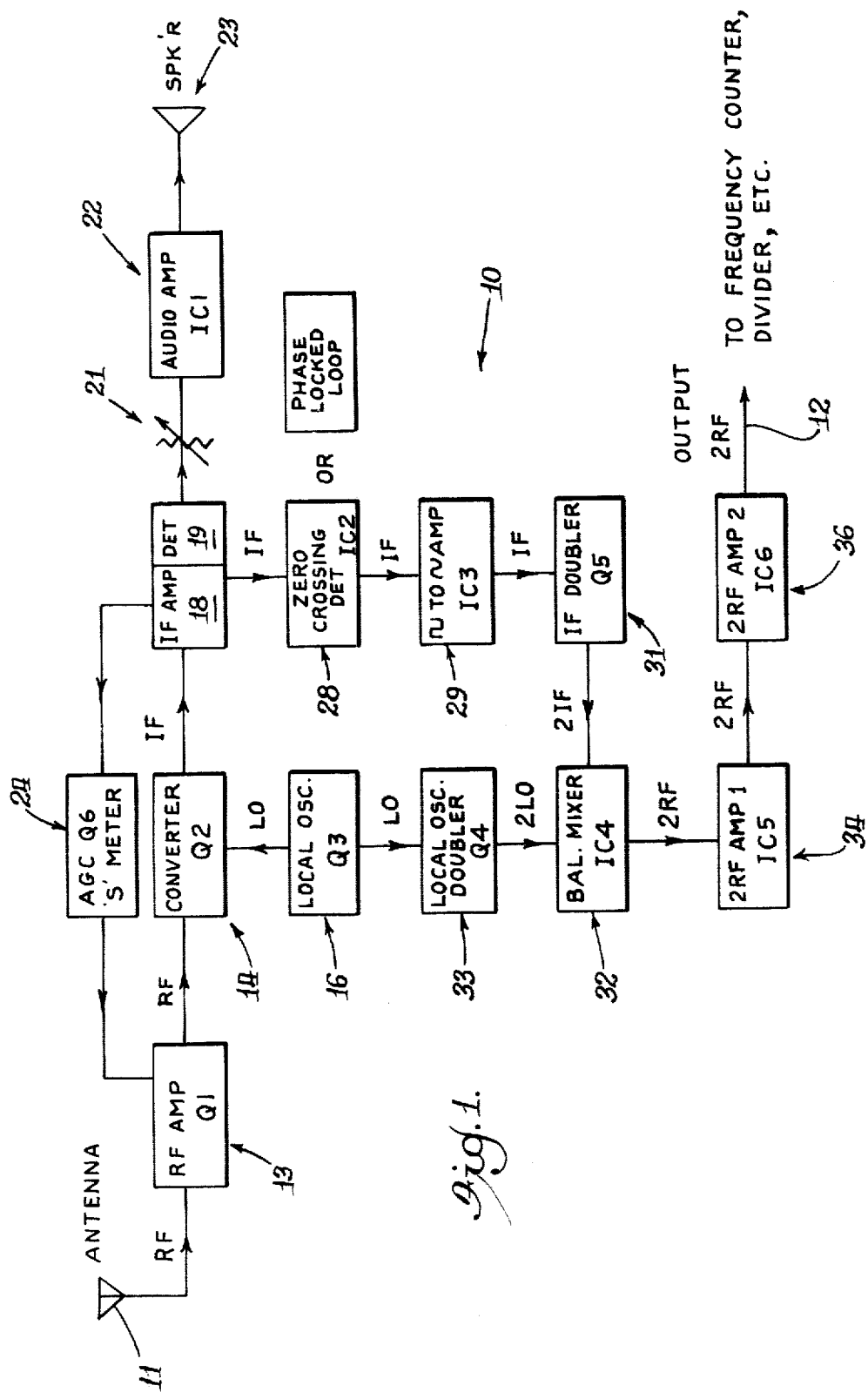
FIG. 1 is a block diagram illustrating the essential features of the preferred embodiment of the present invention.

With reference to FIG. 1, a frequency standard, generally designated by reference numeral 10, receives a radio frequency ("RF") signal, preferably at a standard frequency, through the use of an antenna 11 and provides, at an output 12, a signal at a frequency which is directly related to the carrier frequency of the received radio frequency signal. While the described circuit provides (on output 12) a signal having a frequency twice that of the received signal, it will be recognized that other suitable multiples or submultiples may be obtained with appropriate modification of the described circuitry.

If the received signal is from a standard transmitting station such as WWV, the output 12 can be used as a standard for calibrating secondary frequency standards such as frequency counters; it can also be used for checking the stability of other radio frequency generators and the time base of frequency counters. Of course, the output 12 can be multiplied or divided as desired to provide frequency markers. If the carrier frequency of the received RF signal is not at a standard frequency, its carrier frequency can be measured by a frequency counter connected to the output 12.

Figure 2:
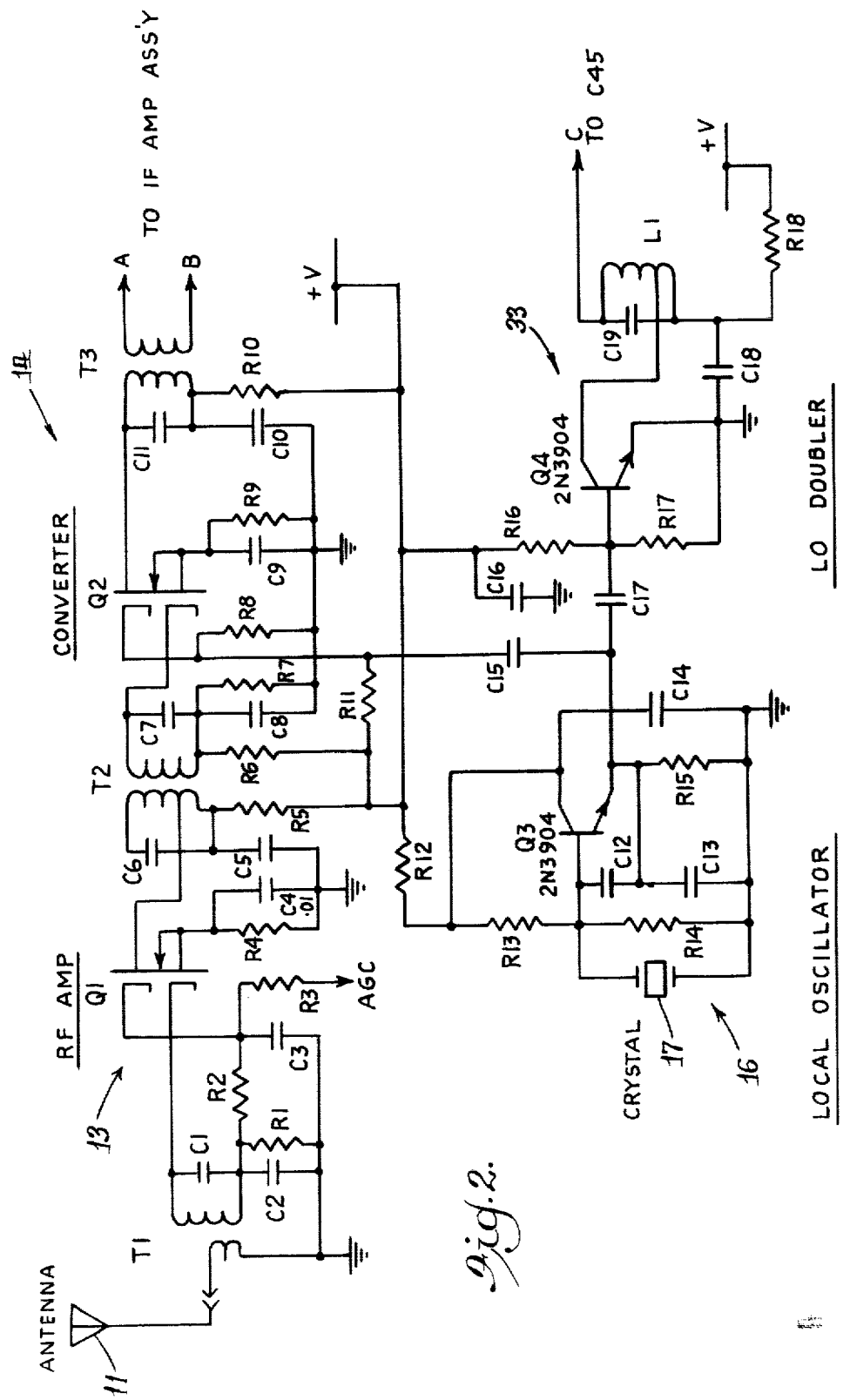

The received radio frequency signal is amplified by a radio frequency amplifier 13 (FIGS. 1 and 2). The amplified output signal is, in turn, supplied to a frequency converter or mixer 14 (FIGS. 1 and 2). With reference to FIG. 2, transformer T1, transistor Q1 and transformer T2 act as a frequency pre-selector. A local oscillator 16 (FIGS. 1 and 2), preferably controlled by a crystal 17, supplies to the mixer 14 a local oscillator ("LO") signal at a frequency determined by the crystal.

Figure 3:
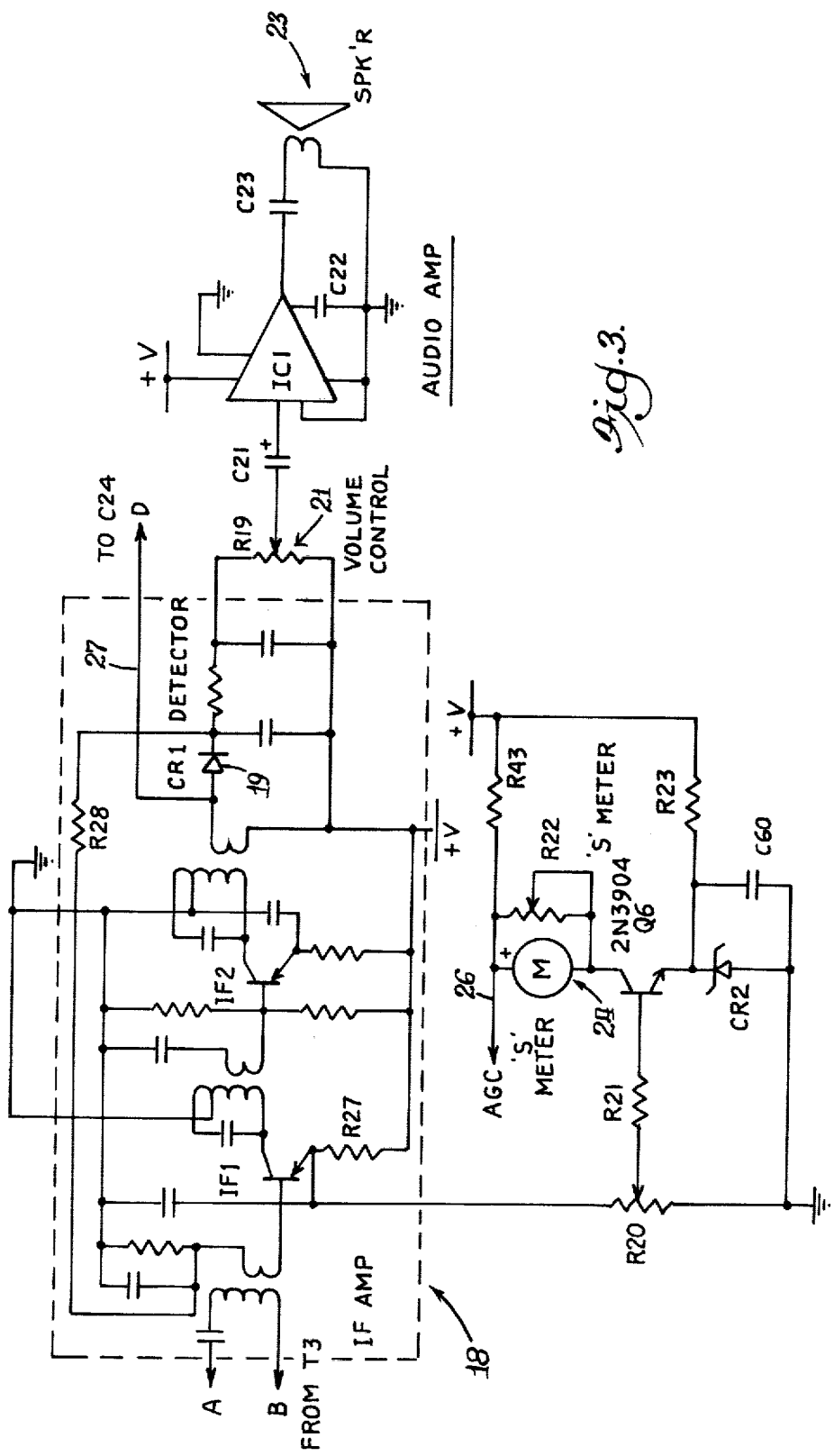

When the amplified radio frequency signal and the local oscillator signal are mixed, an intermediate frequency ("IF") signal is generated in accordance with the well-known superheterodyne principle. This signal is supplied to an intermediate frequency amplifier 18 (FIGS. 1 and 3).

A detector 19 (FIGS. 1 and 3) comprising a diode CR1, a volume control 21, an audio amplifier 22 and a speaker 23 are in circuit with the output of the intermediate frequency amplifier 18 in order to provide means for monitoring and identifying the received RF signal.

Because the direct current component of the signal generated by detector 19 is directly related to the strength of the received radio frequency signal, this DC component can be used to automatically control the overall gain of the receiver by regulating the gain of the first intermediate frequency amplifier transistor IF1 (FIG. 3) through a resistor R28. The change in bias on IF1 also determines the voltage across a resistor R27; this voltage is used to control the bias on a transistor Q6 (FIG. 3) used as a DC amplifier for driving a signal strength meter ("S" meter) 24, which provides a visual indication of the signal strength of the received RF signal.

The drive for the "S" meter is also in circuit with an automatic gain control ("AGC") control line 26 for supplying an automatic gain control signal to a transistor Q1 of the radio frequency amplifier 13 (FIG. 2).

The amplified intermediate frequency signal on a line 27 (FIGS. 3 and 4) is supplied to the input of a zero crossing detector 28 (FIGS. 1 and 4), the output of which is a square wave having a constant amplitude and a frequency equal to that of the intermediate frequency signal. A phase locked loop can be used as an alternative to the zero crossing detector. The output of the zero crossing detector 28 drives a square wave to sine wave amplifier 29 (FIGS. 1 and 4) through an adjustable drive control comprising R26 to regain the intermediate frequency sine wave.

The sine wave output of the square wave to sine wave amplifier 29, at the intermediate frequency, is supplied to an intermediate frequency doubler 31 (FIGS. 1 and 4), the output of which is, in turn, supplied to a balanced mixer 32 (FIGS. 1 and 5). The drive for the balanced mixer 32 is regulated by R30 in the square wave to sine wave amplifier 29.

Also supplied to the balanced mixer 32 is a signal at twice the local oscillator frequency. For this purpose, a local oscillator doubler 33 (FIGS. 1 and 2) is connected to the output of the local oscillator 16.

When signals at twice the local oscillator frequency and at twice the intermediate frequency are mixed in the mixer 32, the result is a signal at a frequency twice that of the received radio frequency signal. RF amplifiers 34 and 36 (FIGS. 1 and 5) amplify the output of the balanced mixer 32 to obtain the output 12 at a useable level.

It will be appreciated that because of the selectivity required for reception of only one station at a time, a superheterodyne receiver is utilized. The present invention avoids the undesirable effects of self-interference or feedback which would otherwise occur upon simple amplification of the RF signal. By multiplying or dividing the intermediate frequency and local oscillator frequency by the same integer factor other than unity and then combining the multiplied or divided signals, a useable signal having a frequency directly related to the frequency of the received RF signal is obtained. The frequency multipliers (illustrated as doublers) break the otherwise present feedback path. Of course, this output can be supplied to desired frequency dividers or counters, depending upon the application of the frequency standard. Furthermore, because the scaled local oscillator frequency and scaled intermediate frequency signals are cancelled out, any instability of the local oscillator 16 has no effect on the result.

It is thought that the present invention and its attendant advantages will be understood from the foregoing description. Various modifications may be made in the form and construction without departing from the spirit and scope of the invention, the form described being merely a preferred embodiment.

The embodiments of the invention in which an exclusive property or privilege is claimed are defined as follows:

1. A frequency standard operable to provide an output signal at a frequency which is directly proportional to the frequency of a radiated radio frequency signal, comprising:
   means for receiving the radio frequency signal;
   means for generating a signal at a local oscillator frequency;
   means for mixing the radio frequency and local oscillator signals in order to derive a signal at an intermediate frequency;
   means for scaling the frequencies of each of the local oscillator and intermediate frequency signals by the same integer factor other than unity; and
   means for mixing the frequency-scaled local oscillator and intermediate frequency signals in order to obtain the output signal.

2. The frequency standard of claim 1 and means for amplifying the intermediate frequency signal.

3. The frequency standard of claim 1 wherein the receiving means comprises an amplifying means.

4. The frequency standard of claim 3 and automatic gain control means for regulating the gain of the amplifying means.

5. The frequency standard of claim 4 and a signal strength meter in circuit with the automatic gain control means.

6. The frequency standard of claim 1 and audio detecting and amplifying means in circuit with the intermediate frequency signal to permit audio monitoring of the received radio frequency signal.

7. The frequency standard of claim 1 and zero crossing detector means and square wave to sine wave amplifier means in circuit with the intermediate frequency signal.

8. The frequency standard of claim 1 wherein the means for mixing the frequency-scaled local oscillator and intermediate frequency signals comprises a balanced mixer.

* * * * *